US012811094B2

(12) United States Patent
Uchida et al.

(10) Patent No.: US 12,811,094 B2
(45) Date of Patent: Nov. 24, 2026

(54) ION BEAM IRRADIATION METHOD AND ION BEAM IRRADIATION APPARATUS

(71) Applicant: NISSIN ION EQUIPMENT CO., LTD., Koka-city (JP)

(72) Inventors: Yuya Uchida, Koka-city (JP); Hiroaki Kai, Koka-city (JP)

(73) Assignee: NISSIN ION EQUIPMENT CO., LTD., Koka-city (JP)

( * ) Notice: Subject to any disclaimer, the term of this patent is extended or adjusted under 35 U.S.C. 154(b) by 379 days.

(21) Appl. No.: 18/611,098

(22) Filed: Mar. 20, 2024

(65) Prior Publication Data

US 2024/0331973 A1 Oct. 3, 2024

(30) Foreign Application Priority Data

Mar. 27, 2023 (JP) ................................ 2023-049894

(51) Int. Cl.
*H01J 37/317* (2006.01)

(52) U.S. Cl.
CPC . *H01J 37/3171* (2013.01); *H01J 2237/31705* (2013.01)

(58) Field of Classification Search
CPC ......... H01J 37/3171; H01J 2237/31705; H01J 2237/24535; H01J 37/3023; H01J 37/08
See application file for complete search history.

(56) References Cited

U.S. PATENT DOCUMENTS

| | | | | |
|---|---|---|---|---|
| 7,098,614 | B2 * | 8/2006 | Yamashita | H01J 37/3171 250/492.21 |
| 7,375,354 | B2 * | 5/2008 | Iwasawa | H01J 37/3171 250/492.21 |
| 2005/0184254 | A1 * | 8/2005 | Matsumoto | H01J 37/3171 257/E21.334 |
| 2006/0192142 | A1 * | 8/2006 | Yamashita | H01J 37/304 250/492.1 |
| 2007/0137671 | A1 * | 6/2007 | DiVergilio | H01J 37/08 134/1 |
| 2007/0193513 | A1 * | 8/2007 | Deguchi | H01J 37/32192 |
| 2008/0073581 | A1 * | 3/2008 | Ikejiri | H01J 37/09 250/492.21 |
| 2008/0121822 | A1 * | 5/2008 | Fujita | H01J 37/3171 250/492.21 |
| 2020/0312616 | A1 * | 10/2020 | Takemura | H01J 37/3171 |
| 2021/0013000 | A1 | 1/2021 | Scoggins et al. | |
| 2024/0030004 | A1 * | 1/2024 | Iwanami | H01J 37/08 |
| 2024/0331973 | A1 * | 10/2024 | Uchida | H01J 37/3171 |
| 2024/0404787 | A1 * | 12/2024 | Hirai | H01J 37/1471 |
| 2025/0379022 | A1 * | 12/2025 | Kai | H01J 37/08 |
| 2026/0018453 | A1 * | 1/2026 | Onoda | H10P 72/7608 |
| 2026/0074138 | A1 * | 3/2026 | Kai | H01J 37/08 |

* cited by examiner

*Primary Examiner* — David A Vanore
(74) *Attorney, Agent, or Firm* — Sughrue Mion, PLLC

(57) ABSTRACT

An ion beam irradiation method includes irradiating, with an ion beam having a first irradiation energy, a rear member located behind an irradiation position in a state in which a target is retracted from the irradiation position, collecting particles generated by irradiating the rear member with the ion beam having the first irradiation energy by conveying a collecting member in a transport direction in front of the rear member, and irradiating, with an ion beam having a second irradiation energy, the target at the irradiation position.

20 Claims, 9 Drawing Sheets

ION BEAM IRRADIATION METHOD AND ION BEAM IRRADIATION APPARATUS

CROSS-REFERENCE TO RELATED APPLICATION

This application claims priority from Japanese Patent Application No. JP 2023-049894, filed in the Japanese Patent Office on Mar. 27, 2023, the disclosure of which being incorporated by reference herein in its entirety.

BACKGROUND

1. Field

Various embodiments are related to an ion beam irradiation method and an ion beam irradiation apparatus.

2. Description of Related Art

In a process of irradiating a target with an ion beam using an ion beam irradiation apparatus, a beam current of the ion beam may be measured before the process is started.

While the beam current is measured, the target is not placed at an irradiation position at which the target is irradiated by the ion beam, and thus the ion beam irradiates a member located behind the irradiation position.

SUMMARY

It is an aspect to reduce the adhesion of particles to a target when an ion beam having a relatively low irradiation energy is used.

According to an aspect of one or more embodiments, there is provided an ion beam irradiation method comprising before irradiating a target at an irradiation position with an ion beam: irradiating a rear member located behind the irradiation position with the ion beam in a state in which the target is retracted from the irradiation position; and collecting particles generated by irradiating the rear member with the ion beam by conveying a collection member in a transport direction in front of the rear member.

According to another aspect of one or more embodiments, there is provided an ion beam irradiation apparatus for executing a processing step of irradiating a target with an ion beam, the ion beam irradiation apparatus comprising an ion source from which the ion beam is extracted; and a processing chamber. In a state in which the target is retracted from an irradiation position within the processing chamber: a rear member located behind the irradiation position in the processing chamber is irradiated with the ion beam; and particles generated by irradiating the rear member with the ion beam are collected by transporting a collection member in front of the rear member.

According to yet another aspect of one or more embodiments, there is provided an ion beam irradiation method comprising irradiating, with an ion beam having a first irradiation energy, a rear member located behind an irradiation position in a state in which a target is retracted from the irradiation position; collecting particles generated by irradiating the rear member with the ion beam having the first irradiation energy by conveying a collection member in a transport direction in front of the rear member; and irradiating, with an ion beam having a second irradiation energy, the target at the irradiation position.

DETAILED DESCRIPTION

Figure 1:
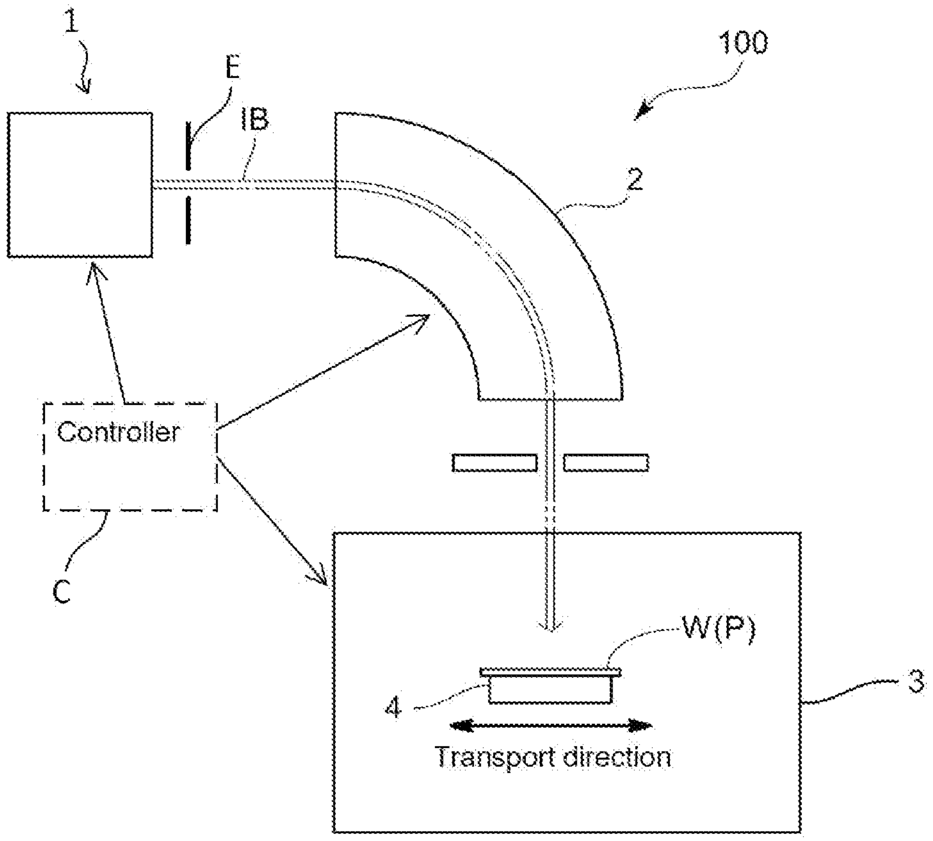
FIG. 1 is a schematic diagram showing an overall configuration of an ion beam irradiation apparatus, according to an embodiment.

As used in this specification, the phrase "at least one of A, B, and C" includes within its scope "only A", "only B", "only C", "A and B", "B and C", "A and C", and "all A, B, and C."

In the ion beam irradiation process, while the beam current is measured, the target is not placed at the irradiation position at which the target will be irradiated by the ion beam, and thus the ion beam irradiates a member (rear member) located behind the irradiation position. The target may be, for example, a wafer. The rear member may be, for example, an inner wall of the processing chamber or a beam dump for safely shielding the ion beam.

When the irradiation energy of the ion beam is relatively high, very little deposit is formed on the rear member. A reason for this low level of deposit is considered to be because even if the particles carried by the ion beam adhere to the rear member, the particles are immediately ejected from the rear member by subsequent particles carried by the ion beam because the irradiation energy of the ion beam is relatively high.

However, for example, when an ion beam irradiates a target to modify the surface of the target, an ion beam having lower irradiation energy than that in the related art ion implantation may irradiate the target such as a wafer. As used in this specification, the term "low-energy" means energy equal to or lower than 20 keV.

It has been observed that when a low energy ion beam irradiates the rear member for a long period of time, a large amount of deposits are formed in a region irradiated with the ion beam. The deposits are considered to be a thin film formed by low-energy ions or materials in the beam line carried by the ion beam. It is considered that the deposit is formed by the deposition of these low-energy ions or materials on the rear member without being ejected by subsequent particles carried by the ion beam because the irradiation energy of the ion beam is low.

When particles are ejected from the deposits on the rear member by the ion beam that irradiates the rear member at a certain timing, a large amount of particles float in front of the rear member. This timing may be, for example, after switching to an ion beam having a different energy, or when the amount of deposits becomes so large that it becomes easy to peel off the deposit even with an ion beam having the same energy.

Thereafter, when the processing of the wafer is started, the particles adhere to the surface of the target by an electrostatic force or a van der Waals force while the target passes through the space where the particles are floating.

The generation of such particles is not limited to the time of measuring the beam current.

Hereinafter, various embodiments of an ion beam irradiation method and ion beam irradiation apparatus are disclosed with reference to the drawings.

The ion beam irradiation apparatus of the various embodiments may be used, for example, in a semiconductor manufacturing process, and may be used to irradiate a target with an ion beam and modify the surface of the target. The application of the ion beam irradiation apparatus is not limited to a surface modification, and may be used, for example, for etching.

FIG. 1 is a schematic diagram showing an overall configuration of an ion beam irradiation apparatus, according to an embodiment. As shown in FIG. 1, the ion beam irradiation apparatus 100 includes an ion source 1 that generates an ion beam IB, a mass separator 2 that performs mass separation of the ion beam IB extracted from the ion source 1 by extraction electrodes E, a processing chamber 3 in which a target W on a target holder 4 is irradiated with the ion beam IB while the target holder 4 moves in a transport direction, and a controller C which controls the ion beam irradiation apparatus 100. In some embodiments, the controller C may control the ion source 1, the mass separator 2, processing chamber 3, and/or the target holder 4. In some embodiments, the controller C may be omitted. The target W in an embodiment is a wafer, but the target W is not limited to a wafer. In some embodiments, the target W may be, for example, a glass substrate or a synthetic polymer.

Figure 2:
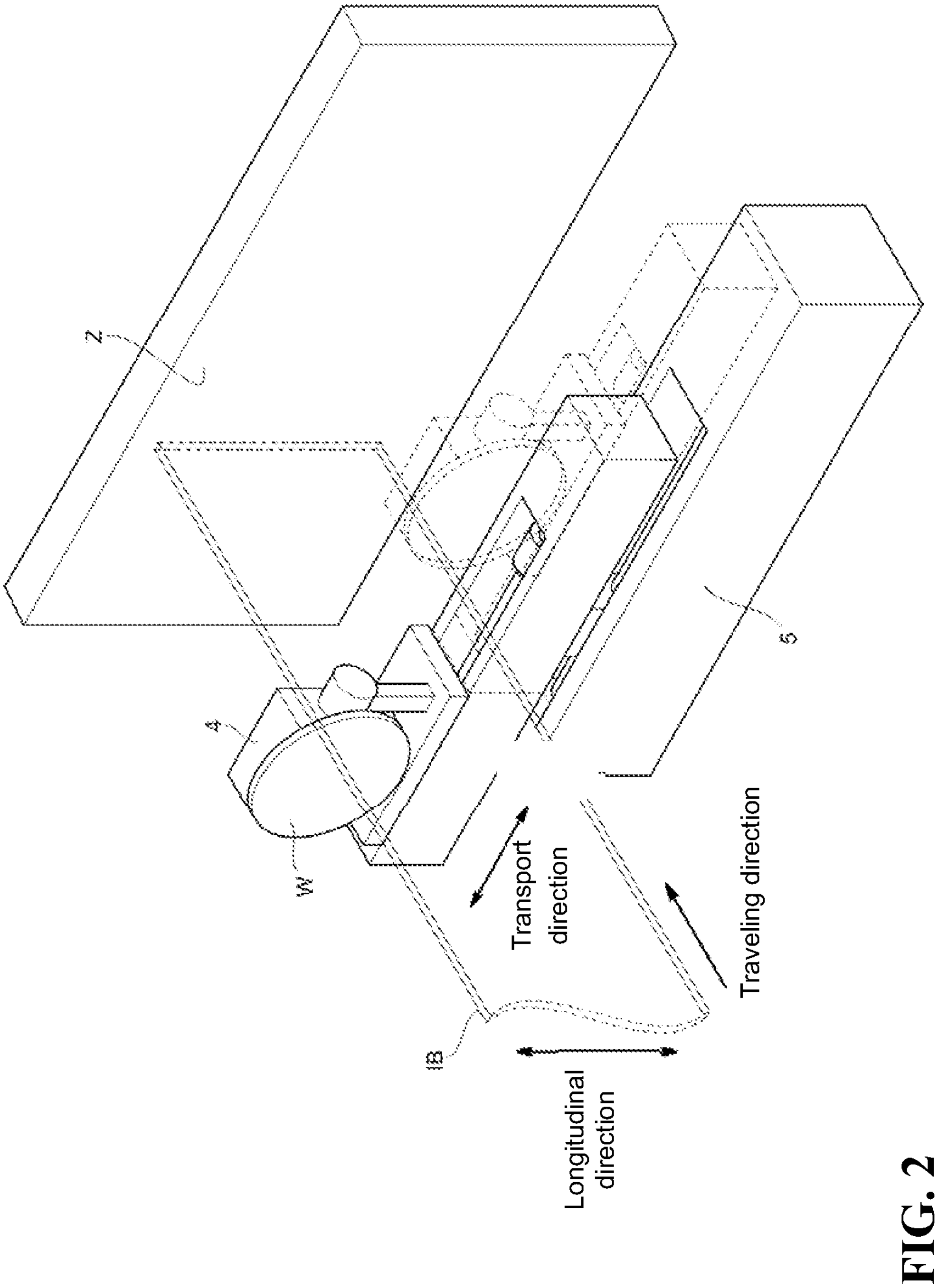
FIG. 2 is a schematic view showing an example of a configuration of an inside of a processing chamber of the ion beam irradiation apparatus of FIG. 1, according to an embodiment.

FIG. 2 is a schematic view showing an example of a configuration of an inside of the processing chamber 3 of FIG. 1, according to an embodiment. As shown in FIG. 2, the ion beam irradiation apparatus 100 further includes the target holder 4 that is provided in the processing chamber 3 and configured to hold the target W, and a transport mechanism 5 configured to transport the target holder 4 in the transport direction.

In a processing step in which the target W is irradiated with the ion beam IB, the transport mechanism 5 transports the target holder 4 in a reciprocating manner so that the target W passes through an irradiation position P (the position of the target W in FIG. 1), which is a position irradiated with the ion beam IB, a plurality of times.

As shown in FIG. 2, in an embodiment, the ion beam IB has an elongated shape in which a cross section extends vertically. The direction in which the target holder 4 is transported by the transport mechanism 5 is a direction orthogonal to both the longitudinal direction of the cross section of the ion beam IB and the traveling direction of the ion beam IB towards a rear member Z.

The ion beam irradiation apparatus 100 irradiates the target W with the low-energy ion beam IB having an irradiation energy equal to or lower than 20 keV in the processing step. The irradiation energy is the energy of the ion beam IB when the ion beam IB irradiates the target W.

As discussed above, when the ion beam IB having low energy is used, particles may float in front of the rear member Z which is a member located behind the irradiation position P. The term "front" or "front side" mentioned here denotes an upstream side in the traveling direction of the ion beam IB. Further, as an example of the rear member Z, a wall surface of the processing chamber, a measurement device for measuring a beam current such as a Faraday cup, or a member such as a beam dump for safely shielding the ion beam IB may be exemplified, but the rear member Z is not limited thereto.

In the related art, the deposits are not easily accumulated in the rear member Z. One of the reasons for this is that the temperature of the rear member increases due to the irradiation of the ion beam having a relatively high irradiation energy, and the bonding force between the rear member and the particles is weakened, so that the particles may be ejected. Further, it is considered that, when the related art ion beam having relatively high irradiation energy irradiates the rear member, the surface temperature of the rear member becomes relatively high, and thus the thermal kinetic energy of the molecules becomes large, and the particles are not easily aggregated on the surface of the rear member in the first place. On the other hand, when the rear member is irradiated with the low-energy ion beam of 20 keV or less, the temperature of the rear member does not become as high as that of the related art rear member. As a result, the particles are easily attached to the rear member, which is also considered as one of the factors that the particles are easily deposited on the rear member as compared with the related art.

Figure 3:
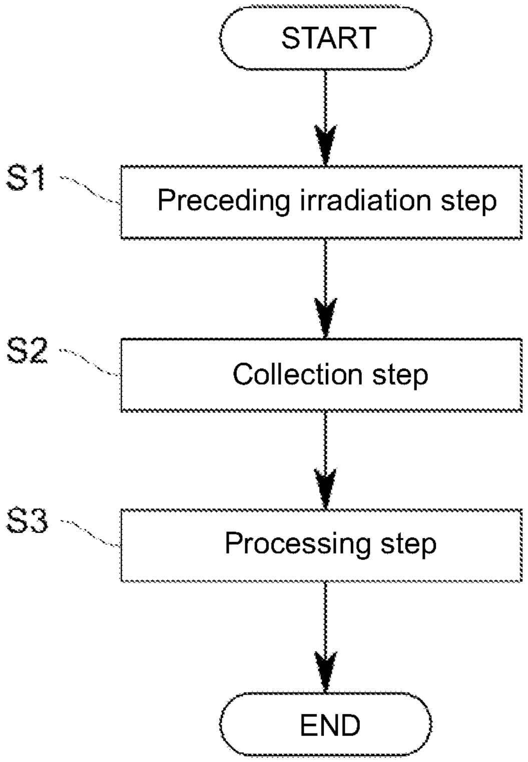
FIG. 3 is a flowchart of an example of an ion beam irradiation method, according to an embodiment.

FIG. 3 is a flowchart of an example of an ion beam irradiation method, according to an embodiment.

As shown in FIG. 3, the ion beam irradiation apparatus 100 is configured to be able to execute an ion beam irradiation method including a preceding irradiation step S1 and a collection step S2 before a processing step S3. In some embodiments, the preceding irradiation step S1, the collection step S2, and the processing step S3 may be automatically performed by the controller C. In some embodiments, the controller C may be omitted and the preceding irradiation step S1, the collection step S2, and the processing step S3 may be manually performed by an operator. In some embodiments, the controller C may be hardware control logic configured to perform the preceding irradiation step S1, the collection step S2, and the processing step S3. In some embodiments, the controller C may be a processor, such as a microprocessor, a microcontroller, an ASIC, etc., configured to access program code stored in a memory and execute the program code to cause the processor to perform the preceding irradiation step S1, the collection step S2, and the processing step S3. In some embodiments, the program code may include separate program code for executing each of the preceding irradiation step S1, the collection step S2, and the processing step S3. In some embodiments, the same program code may cause the processor to execute all of the preceding irradiation step S1, the collection step S2, and the processing step S3.

Figure 4:
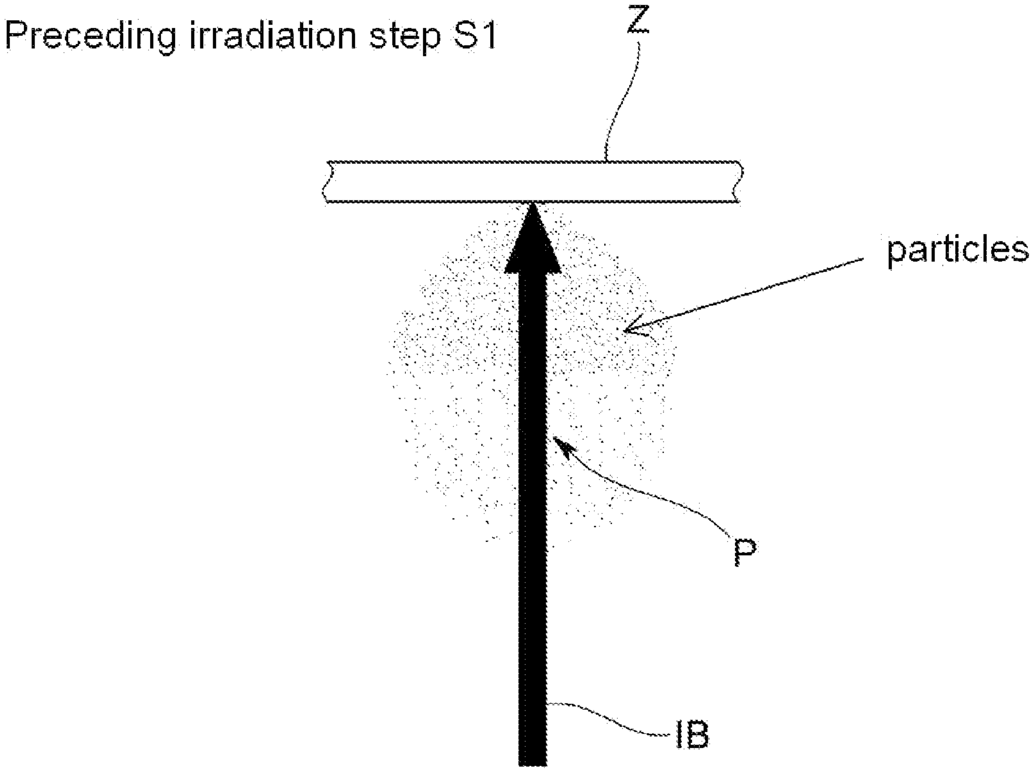
FIG. 4 is a schematic view for explaining a preceding irradiation step, according to an embodiment.

FIG. 4 is a schematic view for explaining a preceding irradiation step, according to an embodiment. As shown in FIG. 4, the preceding irradiation step S1 is a process in which the ion beam IB irradiates the rear member Z located behind the irradiation position P in a state in which the target W is located at a position away from the irradiation position P before the processing step S3. In the preceding irradiation step S1, the target W is not placed on the target holder 4, and is accommodated in, for example, a load lock adjacent to the processing chamber 3.

The preceding irradiation step S1 is a process of ejecting particles from the rear member Z by irradiating the rear member Z with the ion beam IB. In other words, the preceding irradiation step S1 is a process in which the ion beam IB having irradiation energy of a magnitude capable of ejecting particles is irradiated to the rear member Z.

To be specific, the irradiation energy of the ion beam IB irradiated to the rear member Z in the preceding irradiation step S1 is equal to or higher than the irradiation energy of the ion beam IB irradiated to the rear member Z in the processing step S3. For example, in some embodiments, the ion beam IB in the preceding irradiation step S1 may have irradiation energy of greater than 20 keV.

However, if the irradiation energy in the preceding irradiation step S1 is too high, the number of ions entering (implanted into) the rear member Z increases. Therefore, it is advantageous that the irradiation energy of the ion beam IB with which the rear member Z is irradiated in the preceding irradiation step S1 is appropriately set according to the ion species included in the ion beam IB.

In an embodiment, the ion species included in the ion beam IB is not changed between the preceding irradiation step S1 and the processing step S3. The ion beam irradiation apparatus 100 is controlled such that the irradiation energy applied to the rear member Z in the preceding irradiation step S1 is larger than the irradiation energy applied to the rear member Z in the processing step S3 by changing the voltage applied to the extraction electrodes E included in the ion source 1.

In some embodiments, the ion species included in the ion beam IB may be different between the preceding irradiation step S1 and the processing step S3.

In some embodiments, the ion species included in the ion beam IB in the preceding irradiation step S1 and the ion species included in the ion beam IB in the processing step S3 may be the same. In some embodiments, the irradiation energy of the ion beam IB irradiated onto the rear member Z in the preceding irradiation step S1 may be equal to the irradiation energy of the ion beam IB irradiated to the rear member Z in the processing step S3.

In some embodiments, in the preceding irradiation step S1, the beam current of the ion beam IB may be measured by a measurement device such as a Faraday cup.

Figure 5:
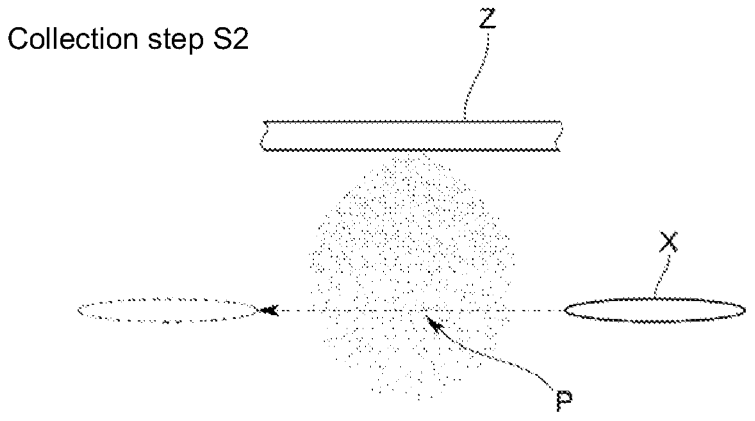
FIG. 5 is a schematic view for explaining a collection step, according to an embodiment.

FIG. 5 is a schematic view for explaining a collection step, according to an embodiment. As shown in FIG. 5, the collection step S2 is a process of capturing particles generated by irradiating the rear member Z with the ion beam IB by transporting the collection member X in front of the rear member Z. In some embodiments, in the collection step S2, the ion beam IB may be withdrawn and the ion source 1 may be stopped.

In the embodiment illustrated in FIG. 5, the collection member X is a flat plate different from the target W in at least one of material, size, and shape. In some embodiments, the collection member X may be the same type of member as the target W. That is, the member having the same material, size, and shape as the target W can also be used as the collection member X.

The collection step S2 is a process that starts after the preceding irradiation step S1 and ends before the processing step S3. In the collection step S2, the target holder 4 is transported by the transport mechanism 5 in a state in which a collection member X that is different from the target W is held by the target holder 4.

That is, in the collection step S2 of the embodiment illustrated in FIG. 5, the collection member X is transported along a same transport path as the transport path of the target W in the processing step S3, and passes through the irradiation position P once or a plurality of times. In some embodiments, the conveying distance of the collection member X in the collection step S2 may be equal to the conveying distance of the target W in the processing step S3. In some embodiments, the conveying distance of the collection member X in the collection step S2 may be longer or shorter than the conveying distance of the target W in the processing step S3.

Specifically, the direction of conveyance of the collection member X in the collection step S2 may be a direction orthogonal to both the longitudinal direction and the direction of travel of the ion beam IB, similarly to the direction of conveyance of the target W in the processing step S3, and the collection member X is conveyed in a state in which the front surface and the back surface are parallel to the direction of conveyance.

In the collection step S2, the particles floating in front of the rear member Z adhere to the front and rear surfaces of the collection member X.

In the processing step S3, the ion beam IB may irradiate the target W while the target W is transported along the transport path and passes through the irradiation position P once or a plurality of times. In some embodiments, the ion beam IB having a relatively low irradiation energy may irradiate the target W. For example, in some embodiments, the irradiation energy may be less than or equal to 20 keV.

In the embodiment illustrated in FIG. 3, after the collection step S2 is completed, a measure measurement step (not shown) may be performed on the beam current of the ion beam IB to be used in the processing step S3, and the processing step S3 may be started when the measured value satisfies a predetermined condition. In some embodiments, the beam current may be measured in the preceding irradiation step S1 and, in such a case, the measurement step after the collection step S2 may be omitted.

According to the ion beam irradiation method of an embodiment, the particles are ejected from the rear member Z in the preceding irradiation step S1, and the particles floating in front of the rear member Z are collected in the collection step S2. Therefore, when the ion beam IB having a relatively low irradiation energy is irradiated to the target W in the processing step S3, the adhesion of particles to the target W in the processing step S3 may be reduced.

In the embodiment described above with respect to FIGS. 3-5, the irradiation energy of the ion beam IB that irradiates the rear member Z in the preceding irradiation step S1 is equal to or higher than the irradiation energy of the ion beam IB that irradiates the target W in the processing step S3. Therefore, in the preceding irradiation step S1, for example, the particles are ejected to the same distance as or a distance farther than the distance at the time of measuring the beam current, and thus many particles which may be attached in the processing step S3 can be collected.

In the preceding irradiation step S1, the ion beam having irradiation energy higher than that in the processing step S3 is irradiated to the rear member Z, and thus the temperature of the rear member Z is increased, and the bonding force between the rear member Z and the particles is weakened, and thus the particles may be easily ejected.

Further, since the collecting member X is different from the target W, an inexpensive member can be used as the collecting member X.

Figure 6:
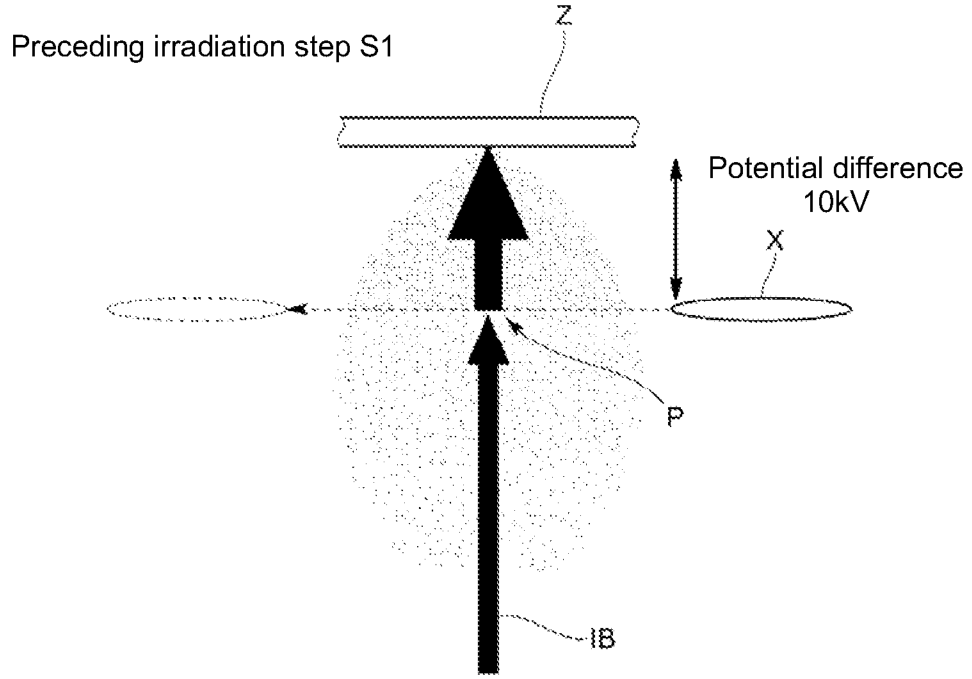
FIG. 6 is a schematic view for explaining a preceding irradiation step, according to an embodiment.

FIG. 6 is a schematic view for explaining a preceding irradiation step, according to an embodiment. As shown in FIG. 6, in some embodiments, in the preceding irradiation step S1, an acceleration voltage for accelerating the ion beam IB may be applied to the rear member Z. For example, when the ion beam IB includes positive ions and the acceleration voltage is applied to the rear member Z during the preceding irradiation step S1, a potential difference of, for example, about 10 kV may be generated between the collection member X passing through the irradiation position P and the rear member Z by applying a negative voltage to the rear member Z in the collection step S2.

In the embodiment illustrated in FIG. 6, since the particles carried by the ion beam IB are accelerated before the particles hit the rear member Z, the irradiation energy of the ion beam IB that irradiates the rear member Z can be increased without changing the setting of the ion source 1.

Figure 7:
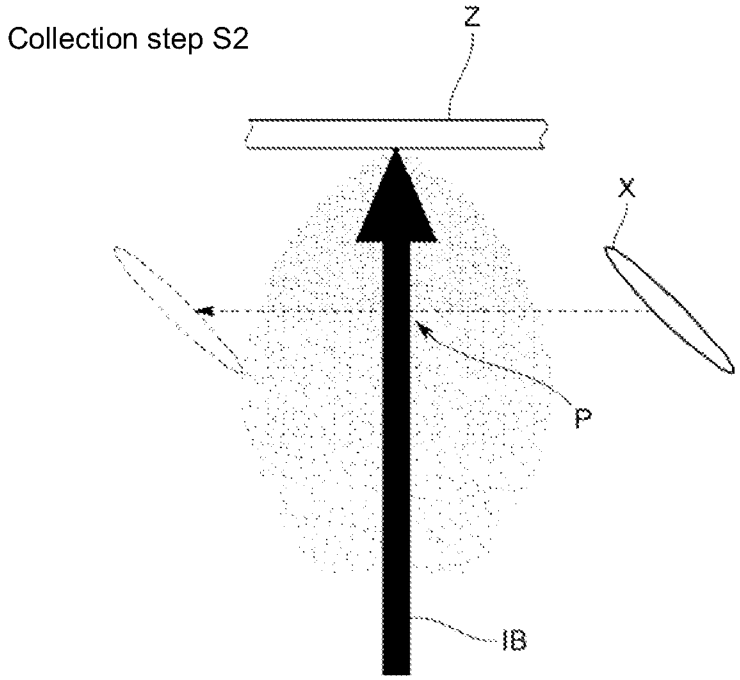
FIG. 7 is a schematic view for explaining a collection step, according to an embodiment.

FIG. 7 is a schematic view for explaining a collection step, according to an embodiment. As shown in FIG. 7, in some embodiments, in the collection step S2, the collection member X may be inclined with respect to the transport direction.

In embodiment illustrated in FIG. 7, the region through which the collection member X passes in one transfer is enlarged, and more particles are recovered in one transfer, so that the particle recovery efficiency is improved.

Further, as the collection member X, for example, a member having a block shape or the like, which has a surface area to which particles are attached that is larger than that of a flat plate shape, may be used.

Figure 8:
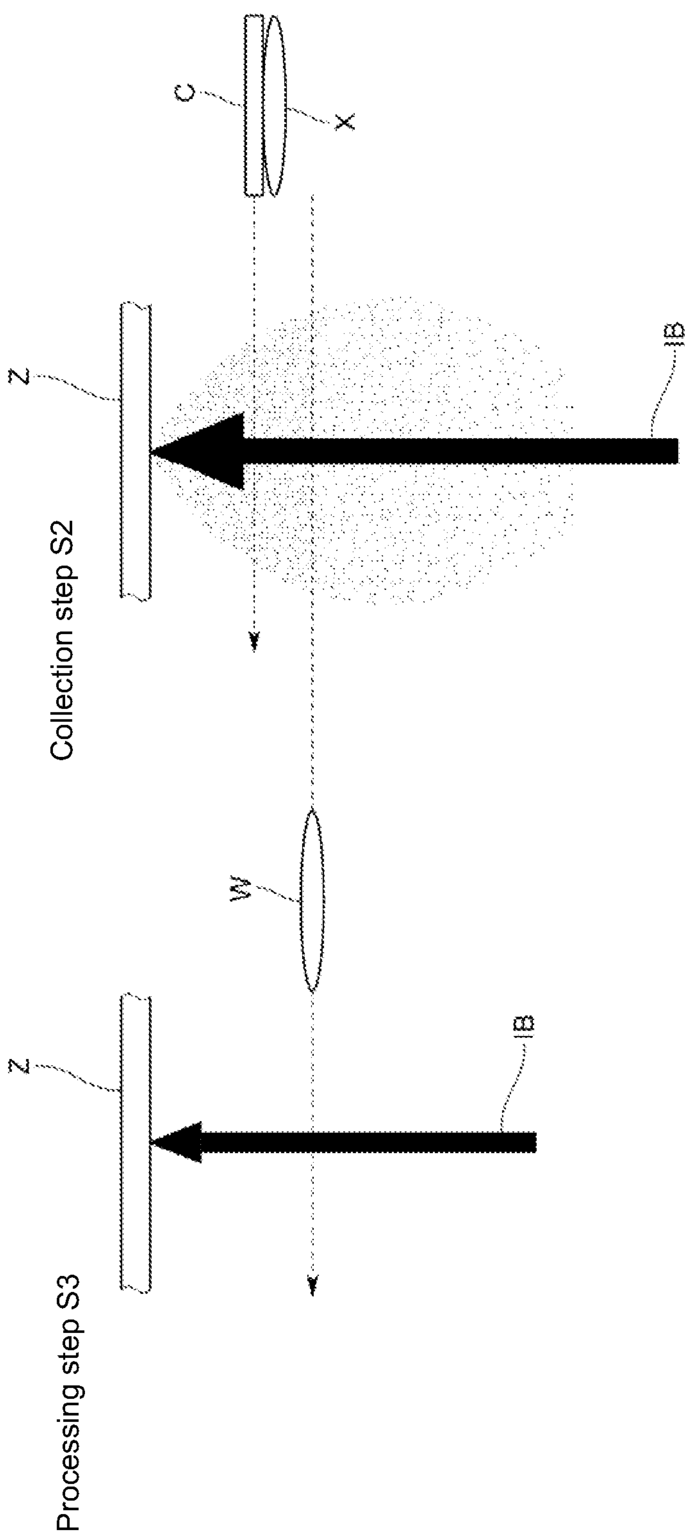
FIG. 8 is a schematic view for explaining a collection step, according to an embodiment.

FIG. 8 is a schematic view for explaining a collection step, according to an embodiment.

As shown in FIG. 8, in some embodiments, the collection member X may be conveyed by using a second conveying mechanism C different from the conveying mechanism 5 that is used for conveying the target W.

In this case, the transport path of the collection member X may be set separately from the transport path of the target W. By applying the second transport mechanism C, the ion beam irradiation apparatus 100 can cause the collection member X to pass through a position optimal for recovering particles. For example, in some embodiments, the position may be closer to the rear member Z than a position at which the target W is irradiated.

Figure 9:
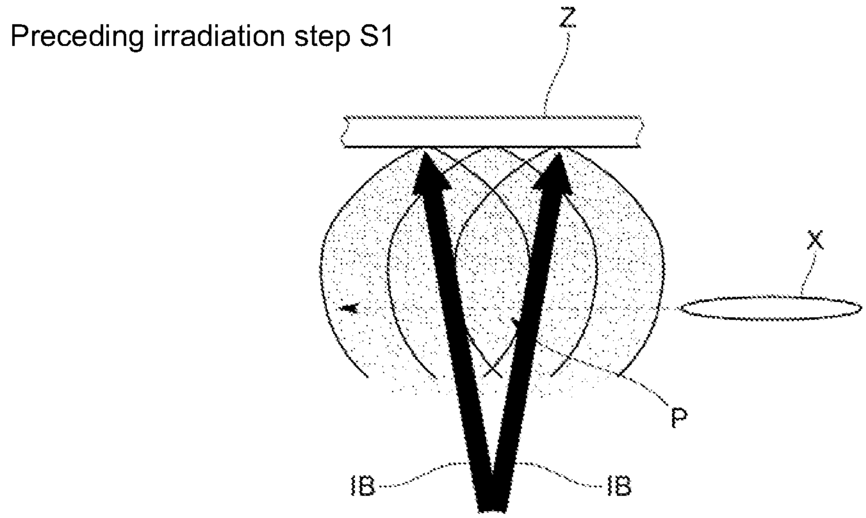
FIG. 9 is a schematic view for explaining a preceding irradiation step, according to an embodiment.

FIG. 9 is a schematic view for explaining a preceding irradiation step, according to an embodiment.

In the preceding irradiation step S1 described above, the irradiation energy is advantageously as large as possible in order to sufficiently eject particles from the rear member Z.

On the other hand, as the irradiation energy increases, the ion beam IB is narrowed, and the region of the rear member Z irradiated with the ion beam IB becomes narrow.

Therefore, as shown in FIG. 9, in the preceding irradiation step S1, the ion beam irradiation device 100 may be configured to change a region of the rear member Z that is irradiated with the ion beam IB by scanning the ion beam IB on the surface of the rear member Z in the transport direction.

For example, in some embodiments, the mass analyzer 2 may be controlled such that the ion beam IB is scanned on the surface of the rear member Z along the conveyance direction of the target W.

In an embodiment in which the ion beam irradiation device 100 includes a scanning mechanism that scans the ion beam IB, the ion beam irradiation device 100 may be controlled such that the ion beam IB is scanned on the surface of the rear member Z along the transport direction of the target W by the scanning mechanism.

In some embodiments, the ion beam IB may be scanned by providing a beam deflector between the mass analyzer 2 and the processing chamber 3.

In the embodiment illustrated in FIG. 9, since the ion beam IB having a large irradiation energy is irradiated over a wide range of the rear member Z, more particles may be collected.

In the case where the irradiation energy of the ion beam IB is the same in the preceding irradiation step S1 as in the processing step S3, the larger the mass of the ion species included in the ion beam IB is, the larger the momentum of the ion species is, and the less likely the ion species is to be implanted into the surface of the rear member Z. Therefore, it is presumed that the effect of removing particles is enhanced as the mass of the ion species included in the ion beam IB is increased.

Therefore, in the ion beam irradiation method, when a value obtained by multiplying the mass of the ion species included in the ion beam by the irradiation energy of the ion beam is set as the irradiation indicator value of the ion beam, the irradiation indicator value of the ion beam that irradiates the rear member Z in the preceding irradiation step S1 may be equal to or larger than the irradiation indicator value of the ion beam that irradiates the target W in the processing step S3.

In some embodiments, in the preceding irradiation step S1, the irradiation energy of the ion beam IB may be changed stepwise or continuously.

In some embodiments, in the collection step S2, the particles may be collected using a plurality of collection members X.

In some embodiments, the preceding irradiation step S1 and the collection step S3 may be repeated a plurality of times. In some embodiments, the wafer transfer speed in the collection step S2 may be different from the processing speed which is the speed at which the target W is transferred while the target W is irradiated with the ion beam IB. In some embodiments, the transfer region for transferring the target W in the collection step S2 may be different from the region for transferring the target W in the processing step S3.

In some embodiments, the preceding irradiation step S1 and the collection step S2 may be executed before the operation of the ion beam irradiation apparatus 100 is terminated. In other words, the processing of the target W in the processing step S3 may be performed first in the ion beam irradiation method, and then the preceding irradiation step S1 and the collection step S2 may be performed after the processing step S3. In this case, even if the processing step S3 is not performed immediately after the preceding irradiation and collections steps S1 and S2, the particles floating in the processing chamber 3 can be collected, and thus, the adhesion of the particles to the target W in the processing step S3 during the next operation of the apparatus 100 can be reduced.

While various embodiments have been shown and described above with respect to the drawings, various changes and modifications may be made thereto without departing from the spirit and scope of the present disclosure and all such changes and modification are intended to be included within the scope of the appended claims.

What is claimed is:

1. An ion beam irradiation method comprising:

before irradiating a target at an irradiation position with an ion beam: irradiating a rear member located behind the irradiation position with the ion beam in a state in which the target is retracted from the irradiation position; and collecting particles generated by irradiating the rear member with the ion beam by conveying a collection member in a transport direction in front of the rear member.

2. The ion beam irradiation method according to claim 1, wherein an irradiation energy of the ion beam that irradiates the rear member is equal to or higher than an irradiation energy of the ion beam that is used to irradiate the target.

3. The ion beam irradiation method according to claim 1, wherein the irradiating the rear member is performed such that, an irradiation index value of the ion beam that irradiates the rear member is equal to or larger than an irradiation index value of the ion beam that is used to irradiate the target, and wherein the irradiation index value is obtained by multiplying a mass of an ion species included in the ion beam by an irradiation energy of the ion beam.

4. The ion beam irradiation method according to claim 1, wherein an irradiation energy of the ion beam that irradiates the target is equal to or less than 20 keV.

5. The ion beam irradiation method according to claim 1, wherein irradiating the rear member comprises applying an acceleration voltage to the rear member for accelerating the ion beam.

6. The ion beam irradiation method according to claim 1, wherein the collection member is different from the target.

7. The ion beam irradiation method according to claim 1, wherein the collection member is inclined with respect to the transport direction.

8. The ion beam irradiation method according to claim 1, wherein irradiating the rear member comprises changing a region of the rear member that is irradiated with the ion beam during the irradiation of the rear member.

9. An ion beam irradiation apparatus for executing a processing step of irradiating a target with an ion beam, the ion beam irradiation apparatus comprising:

an ion source from which the ion beam is extracted; and a processing chamber, wherein, in a state in which the target is retracted from an irradiation position within the processing chamber:

a rear member located behind the irradiation position in the processing chamber is irradiated with the ion beam; and particles generated by irradiating the rear member with the ion beam are collected by transporting a collection member in front of the rear member.

10. The ion beam irradiation apparatus according to claim 9, further comprising a controller, wherein the controller is configured to, in the state in which the target is retracted from the irradiation position within the processing chamber:

irradiate the rear member located behind the irradiation position in the processing chamber with the ion beam; and collect the particles generated by irradiating the rear member with the ion beam by transporting the collection member in front of the rear member.

11. An ion beam irradiation method comprising:

irradiating, with an ion beam having a first irradiation energy, a rear member located behind an irradiation position in a state in which a target is retracted from the irradiation position;

collecting particles generated by irradiating the rear member with the ion beam having the first irradiation energy by conveying a collection member in a transport direction in front of the rear member; and irradiating, with an ion beam having a second irradiation energy, the target at the irradiation position.

12. The ion beam irradiation method according to claim 11, wherein the first irradiation energy is equal to or greater than the second irradiation energy.

13. The ion beam irradiation method according to claim 11, wherein the first irradiation energy is greater than 20 keV.

14. The ion beam irradiation method according to claim 11, wherein the second irradiation energy is equal to or less than 20 keV.

15. The ion beam irradiation method according to claim 11, wherein irradiating the rear member comprises applying an acceleration voltage to the rear member for accelerating the ion beam.

16. The ion beam irradiation method according to claim 11, wherein the collection member is different from the target.

17. The ion beam irradiation method according to claim 11, wherein the collection member is inclined with respect to the transport direction.

18. The ion beam irradiation method according to claim 11, wherein irradiating the rear member comprises changing a region of the rear member that is irradiated with the ion beam during the irradiation of the rear member.

19. The ion beam irradiation method according to claim 11, wherein the rear member is irradiated, the particles are collected and the target is irradiated, in order.

20. The ion beam irradiation method according to claim 11, wherein the target is irradiated, and the rear member is irradiated and the particles are collected, in order.

* * * * *